US012588564B2

(12) United States Patent (10) Patent No.: US 12,588,564 B2
Hirao et al. (45) Date of Patent: Mar. 24, 2026

(54) SEMICONDUCTOR DEVICE

(71) Applicant: FUJI ELECTRIC CO., LTD.,
Kawasaki (JP)

(72) Inventors: Akira Hirao, Matsumoto (JP);
Yoshinari Ikeda, Matsumoto (JP);
Motohito Hori, Matsumoto (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 412 days.

(21) Appl. No.: 18/236,996

(22) Filed: Aug. 23, 2023

(65) Prior Publication Data

US 2024/0128241 A1 Apr. 18, 2024

(30) Foreign Application Priority Data

Oct. 17, 2022 (JP) ................................. 2022-165942

(51) Int. Cl.
| | |
|---|---|
| *H01L 25/07* | (2006.01) |
| *H01L 23/00* | (2006.01) |
| *H01L 23/31* | (2006.01) |
| *H01L 23/498* | (2006.01) |

(52) U.S. Cl.
CPC ........ *H01L 25/072* (2013.01); *H01L 23/3142*
(2013.01); *H01L 23/49811* (2013.01); *H01L*
*23/49844* (2013.01); *H01L 24/16* (2013.01);
*H01L 24/32* (2013.01); *H01L 24/73* (2013.01);
*H01L 2224/16225* (2013.01); *H01L*
*2224/32225* (2013.01); *H01L 2224/73253*
(2013.01); *H01L 2924/13091* (2013.01)

(58) Field of Classification Search
CPC ............... H01L 25/072; H01L 23/3142; H01L
23/49811; H01L 23/49844; H01L 24/16;
H01L 24/32; H01L 24/73; H01L
2224/16225; H01L 2224/32225; H01L
2224/73253; H01L 2924/13091; H01L
23/3121; H01L 24/29
See application file for complete search history.

(56) References Cited

U.S. PATENT DOCUMENTS

| | | | |
|---|---|---|---|
| 9,397,014 | B2 | 7/2016 | Miyazawa et al. |
| 11,521,925 | B2 | 12/2022 | Hirao et al. |
| 2015/0270186 | A1 | 9/2015 | Miyazawa et al. |
| 2017/0279366 | A1 | 9/2017 | Kimura et al. |
| 2021/0125916 | A1 | 4/2021 | Hirao et al. |
| 2022/0375851 | A1* | 11/2022 | Choi ........................ H10D 1/68 |
| 2022/0406689 | A1 | 12/2022 | Hori et al. |
| 2024/0038743 | A1* | 2/2024 | Zhang ................... H01L 25/162 |

FOREIGN PATENT DOCUMENTS

| | | |
|---|---|---|
| JP | 2015-185561 A | 10/2015 |
| JP | 2016-59094 A | 4/2016 |
| JP | 2017-22844 A | 1/2017 |
| JP | 2021-68859 A | 4/2021 |
| JP | 2022-191866 A | 12/2022 |

\* cited by examiner

*Primary Examiner* — Karen Kusumakar

(57) ABSTRACT

A semiconductor device includes: an insulated circuit sub-
strate including a conductive plate on a top surface side; a
semiconductor chip mounted on the conductive plate; and an
external connection terminal electrically connected to the
semiconductor chip and including an inner-side conductor
layer, an outer-side conductor layer provided at a circum-
ference of the inner-side conductor layer, and an insulating
layer interposed between the inner-side conductor layer and
the outer-side conductor layer.

18 Claims, 14 Drawing Sheets

SEMICONDUCTOR DEVICE

CROSS-REFERENCE TO RELATED APPLICATION

This application claims benefit of priority under 35 USC 119 based on Japanese Patent Application No. 2022-165942 filed on Oct. 17, 2022, the entire contents of which are incorporated by reference herein.

BACKGROUND OF THE INVENTION

1. Field of the Invention

The present invention relates to a semiconductor device (a semiconductor module) equipped with a power semiconductor element.

2. Description of the Related Art

Development of power semiconductor devices (simply referred to below as "semiconductor devices") has grown, the semiconductor devices being equipped with a next-generation power semiconductor element including silicon carbide (SiC), gallium nitride (GaN), or gallium oxide ($Ga_2O_3$), for example. Such a power semiconductor element has high dielectric breakdown field intensity as compared with conventional power semiconductor elements including silicon (Si) and thus has a high breakdown voltage, and can be led to have a higher impurity concentration and include an active layer having a smaller thickness than the conventional power semiconductor elements, so as to be favorably used for a semiconductor device having a small size while achieving a high efficiency and a high-speed operation.

JP 2017-022844 A discloses a metal plate extending adjacent and parallel to a flat power terminal, in which an eddy current is caused inside the metal plate because of a magnetic field generated by the power terminal, and the caused eddy current decreases the intensity of the magnetic field, so as to reduce an inductance of the power terminal.

JP 2016-059094 A discloses a power module, in which when a recovery current flows, an eddy current is caused in both of a pair of metal plates in a direction opposite to the recovery current due to an electromagnetic induction effect to offset a magnetic flux derived from the recovery current, so as to reduce an apparent parasitic inductance in a path by a decreased amount of a surge voltage caused in the path.

JP 2015-185561 A discloses a semiconductor device including a plurality of electrodes having extension parts arranged separately from each other at intervals within five millimeters. This structure can offset an alternating magnetic field generated when an AC current is led to flow through one electrode and an eddy current on a surface of another electrode or an alternating magnetic field generated when an AC current is led to flow through another electrode, so as to reduce a self-inductance accordingly.

JP 2021-068859 A discloses a semiconductor module, in which electrical conduction made along a U-shaped path extending from an external connection terminal to another external connection terminal contributes to a decrease in wire length between the external connection terminal to the other external connection terminal, so as to reduce an inductance.

The conventional power semiconductor elements as described above cause a surge voltage due to the parasitic inductance in a main circuit wire, which could further cause damage to the power semiconductor elements.

SUMMARY OF THE INVENTION

In view of the foregoing problems, the present invention provides a semiconductor device equipped with a power semiconductor element having a configuration capable of reducing a parasitic inductance.

An aspect of the present invention inheres in a semiconductor device including: an insulated circuit substrate including a conductive plate on a top surface side; a semiconductor chip mounted on the conductive plate; and an external connection terminal electrically connected to the semiconductor chip and including an inner-side conductor layer, an outer-side conductor layer provided at a circumference of the inner-side conductor layer, and an insulating layer interposed between the inner-side conductor layer and the outer-side conductor layer.

BRIEF DESCRIPTION OF THE DRAWINGS

FIG. 1 is a side view illustrating a semiconductor device according to a first embodiment;

FIG. 2 is a plan view illustrating the semiconductor device according to the first embodiment;

DETAILED DESCRIPTION

Figure 3:
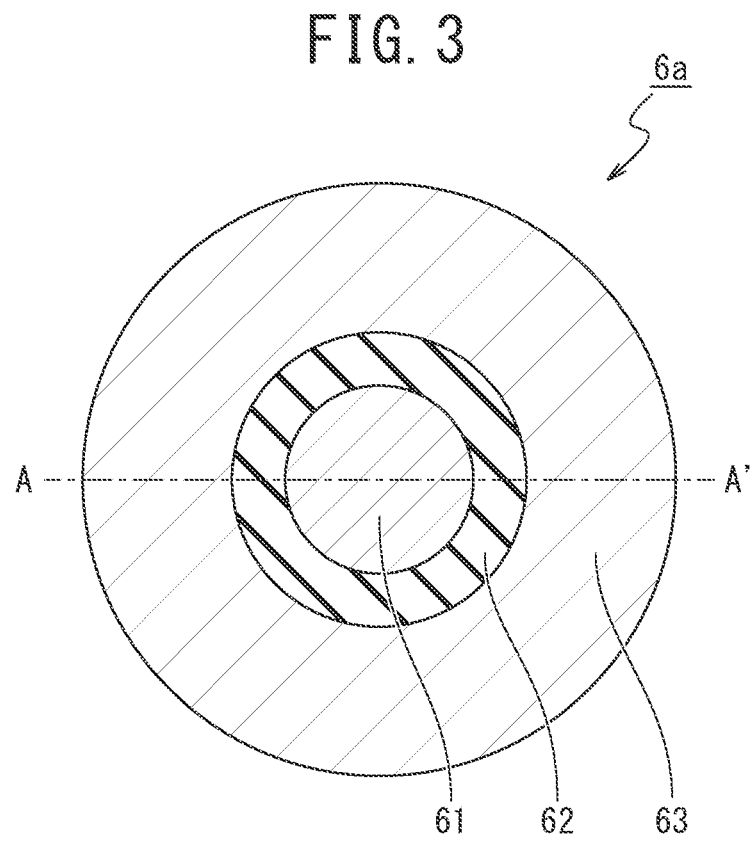
FIG. 3 is a horizontal cross-sectional view illustrating an external connection terminal of the semiconductor device according to the first embodiment.

With reference to the drawings, first to twelfth embodiments of the present invention will be described below.

In the drawings, the same or similar elements are indicated by the same or similar reference numerals. The drawings are schematic, and it should be noted that the relationship between thickness and planer dimensions, the thickness proportion of each layer, and the like are different from real ones. Moreover, in some drawings, portions are illustrated with different dimensional relationships and proportions.

The first to twelfth embodiments described below merely illustrate schematically devices and methods for specifying and giving shapes to the technical idea of the present invention, and the span of the technical idea is not limited to materials, shapes, structures, and relative positions of elements described herein.

In the following description, a "first main electrode" is assigned to any one of an emitter electrode or a collector electrode in an insulated-gate bipolar transistor (IGBT). The first main electrode is assigned to any one of a source electrode or a drain electrode in a field-effect transistor (FET) or a static induction transistor (SIT). The first main electrode is assigned to any one of an anode electrode or a cathode electrode in a static induction (SI) thyristor, a gate turn-off (GTO) thyristor or a diode. A "second main electrode" is assigned to any one of the emitter electrode or the collector electrode in the IGBT, which is not assigned as the first main electrode. The second main electrode is assigned to any one of the source electrode or the drain electrode in the FET or the SIT, which is not assigned as the first main electrode. The second main electrode is assigned to any one of the anode electrode or the cathode electrode in the SI thyristor, the GTO thyristor or the diode, which is not assigned as the first main electrode. That is, when the "first main electrode" is the source electrode, the "second main electrode" means the drain electrode. When the "first main electrode" is the emitter electrode, the "second main electrode" means the collector electrode. When the "first main electrode" is the anode electrode, the "second main electrode" means the cathode electrode.

Additionally, definitions of directions such as "upper", "lower", "upper and lower", "left", "right", and "left and right" in the following description are simply definitions for convenience of description, and do not limit the technological concept of the present invention. For example, when observing an object rotated by 90 degrees, the "upper and lower" is converted to "left and right" to be read, and when observing an object rotated by 180 degrees, the "upper and lower" are read reversed, which should go without saying.

First Embodiment

Figure 1:
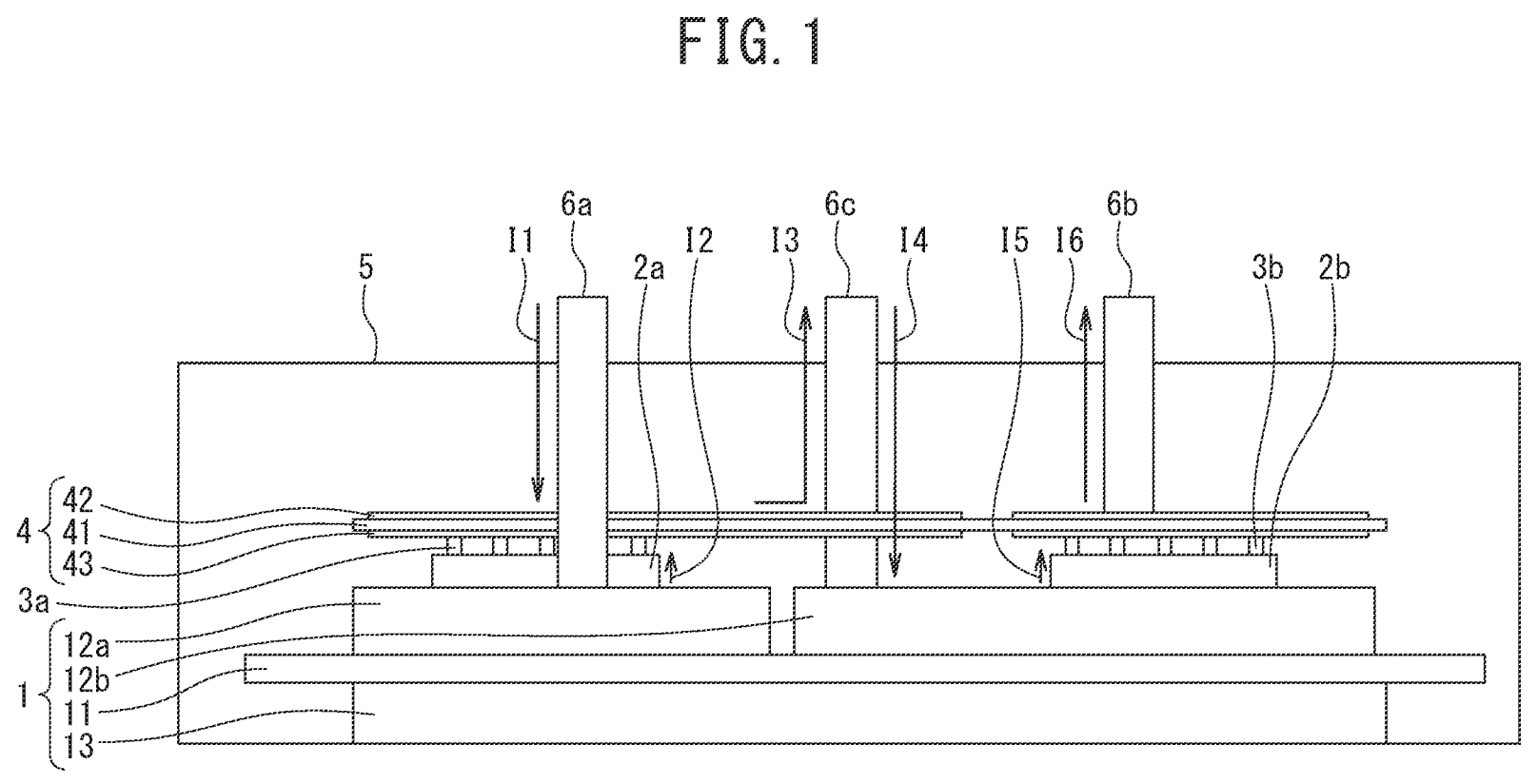

A semiconductor device according to a first embodiment is a "2-in-1" semiconductor module having functions for two power semiconductor elements. As illustrated in FIG. 1, the semiconductor device according to the first embodiment includes an insulated circuit substrate 1, and semiconductor chips 2a and 2b mounted on the insulated circuit substrate 1. A printed wiring board 4 is arranged separately over the respective semiconductor chips 2a and 2b. The respective circumferences of the semiconductor chips 2a and 2b and the printed wiring board 4 are sealed with a sealing member 5 so that the respective semiconductor chips 2a and 2b and the printed wiring board 4 are isolated from the peripheral members.

The insulated circuit substrate 1 includes an insulating substrate 11, upper-side conductor layers (conductive plates) 12a and 12b deposited on the top surface of the insulating substrate 11, and a lower-side conductor layer (a conductive plate) 13 deposited on the bottom surface of the insulating substrate 11. Although not illustrated in FIG. 1, the upper-side conductor layers 12a and 12b are each provided with a particular circuit pattern.

The insulated circuit substrate 1 may be a direct copper bonded (DCB) substrate or an active metal brazed (AMB) substrate, for example. The insulating substrate 11 is a ceramic substrate made from aluminum oxide ($Al_2O_3$), aluminum nitride (AlN), silicon nitride ($Si_3N_4$), or boron nitride (BN), or a resin insulating substrate including polymer material, for example. The upper-side conductor layers 12a and 12b and the lower-side conductor layer 13 are each made of conductor foil including copper (Cu) or aluminum (Al), for example.

The semiconductor chips 2a and 2b are bonded onto the upper-side conductor layers 12a and 12b via bonding material such as solder or sintered material (not illustrated) or by direct bonding means. The respective semiconductor chips 2a and 2b may be made from silicon (Si) material or wide-bandgap semiconductor material such as silicon carbide (SiC), gallium nitride (GaN), or gallium oxide ($Ga_2O_3$), for example.

The semiconductor chips 2a and 2b to be used each can be a power semiconductor element such as a field-effect transistor (FET), an insulated gate bipolar transistor (IGBT), a static induction (SI) thyristor, and a gate turn-off (GTO) thyristor, or a rectifying element such as a freewheeling diode (FWD), for example, although the type to be used depends on its intended purpose.

The semiconductor device according to the first embodiment is illustrated herein with a case in which the semiconductor chips 2a and 2b are each a MOSFET. The semiconductor chips 2a and 2b each include a first main electrode (a source electrode) and a control electrode (a gate electrode) on the top-surface side, and a second main electrode (a drain electrode) on the bottom-surface side.

While FIG. 1 illustrates the case of including the two semiconductor chips 2a and 2b, the number of the semiconductor chips is not limited to this case, and can be determined as appropriate depending on a rated current or the like. The semiconductor device may include either a single semiconductor chip or three or more semiconductor chips, for example.

The semiconductor chips 2a and 2b are connected to the printed wiring board 4 via a plurality of post electrodes (bumps) 3a and 3b. The source electrode of the semiconductor chip 2a is bonded to lower ends of some of the plural post electrodes 3a via bonding material such as solder or sintered material (not illustrated). The gate electrode of the semiconductor chip 2a is bonded to lower ends of the other post electrodes 3a via bonding material such as solder or sintered material (not illustrated). The source electrode of the semiconductor chip 2*b* is bonded to lower ends of some of the plural post electrodes 3*b* via bonding material such as solder or sintered material (not illustrated). The gate electrode of the semiconductor chip 2*b* is bonded to lower ends of the other post electrodes 3*b* via bonding material such as solder or sintered material (not illustrated).

The respective post electrodes 3*a* and 3*b* have a pillar-like shape (a stick-like or pin-like shape), and in particular, can be a round column, a cylindroid, or a polygonal column such as a triangular column or a quadrangular column. The post electrodes 3*a* and 3*b* can be made from metal material such as copper (Cu), for example. The respective post electrodes 3*a* and 3*b* may be bonded to a lower-side wiring layer 43 on the bottom surface side of the printed wiring board 4 or may penetrate to reach an upper-side wiring layer 42 on the top surface side of the printed wiring board 4. The electrical connection between the respective semiconductor chips 2*a* and 2*b* and the printed wiring board 4 may be made by other means instead of the respective post electrodes 3*a* and 3*b*.

The printed wiring board 4 includes an insulating layer 41, the upper-side wiring layer 42 deposited on the top surface of the insulating layer 41, and the lower-side wiring layer 43 deposited on the bottom surface of the insulating layer 41. The insulating layer 41 is made of a resin substrate including polyimide resin or a combination of glass fiber and polyimide resin, for example.

The upper-side wiring layer 42 and the lower-side wiring layer 43 are each made of conductor foil including copper (Cu) or aluminum (Al), for example. Although not illustrated in FIG. 1, the upper-side wiring layer 42 and the lower-side wiring layer 43 are each provided with a particular circuit pattern. The upper-side wiring layer 42 and the lower-side wiring layer 43 may be provided with a common circuit pattern, for example. The upper-side wiring layer 42 and the lower-side wiring layer 43 may be electrically connected to each other via through-holes penetrating the insulating layer 41.

A lower end of an external connection terminal (a drain-side terminal) 6*a* on the high-potential side is bonded to the upper-side conductor layer 12*a* of the insulated circuit substrate 1 via bonding material such as solder or sintered material (not illustrated). The drain-side terminal 6*a* extends upward from the insulated circuit substrate 1. The upper end of the drain-side terminal 6*a* projects from the top surface of the sealing member 5 so as to be connected to an external circuit. The drain-side terminal 6*a* supplies a current to the drain electrode of the semiconductor chip 2*a* via the upper-side conductor layer 12*a* of the insulated circuit substrate 1. The specific structure of the drain-side terminal 6*a* is described below.

An external connection terminal (a source-side terminal) 6*b* on the low-potential side and an external connection terminal (an output terminal) 6*c* on the output side are connected to the upper-side wiring layer 42 of the printed wiring board 4. The lower end of the source-side terminal 6*b* is bonded to the upper-side wiring layer 42 of the printed wiring board 4 via bonding material such as solder or sintered material (not illustrated). The source-side terminal 6*b* extends upward from the printed wiring board 4. The upper end of the source-side terminal 6*b* projects from the top surface of the sealing member 5 so as to be connected to the external circuit. The source-side terminal 6*b* leads a current from the source electrode of the semiconductor chip 2*b* to flow through the external circuit via the post electrode 3*b* and the printed wiring board 4.

The lower end of the output terminal 6*c* is bonded to the upper-side conductor layer 12*b* of the insulated circuit substrate 1 via bonding material such as solder or sintered material (not illustrated). The output terminal 6*c* extends upward from the insulated circuit substrate 1. The upper end of the output terminal 6*c* projects from the top surface of the sealing member 5 so as to be connected to the external circuit. The output terminal 6*c* leads a current from the source electrode of the semiconductor chip 2*a* to flow through the external circuit via the post electrode 3*a* and the printed wiring board 4 when the semiconductor chip 2*a* is in the ON-state. The output terminal 6*c* supplies the current from the external circuit to the drain electrode of the semiconductor chip 2*b* via the upper-side conductor layer 12*b* of the insulated circuit substrate 1 when the semiconductor chip 2*b* is in the ON-state.

Although not illustrated, a plurality of gate control terminals (external connection terminals) and a plurality of auxiliary source terminals (external connection terminals) are connected to the printed wiring board 4. The respective gate control terminals apply a control signal for controlling the ON/OFF state of the respective semiconductor chips 2*a* and 2*b* to each of the gate electrodes of the semiconductor chips 2*a* and 2*b* via the printed wiring board 4 and the respective post electrodes 3*a* and 3*b*. The respective auxiliary source terminals detect the current on the source side of the respective semiconductor chips 2*a* and 2*b* via the respective post electrodes 3*a* and 3*b* and the printed wiring board 4. The term "external connection terminals" as used in the semiconductor device according to the first embodiment includes the drain-side terminal 6*a*, the source-side terminal 6*b*, the output terminal 6*c*, the plural gate control terminals, and the plural auxiliary source terminals.

The sealing member 5 has a substantially cuboidal shape and serves as a casing of the semiconductor device according to the first embodiment. The insulated circuit substrate 1 is exposed on the bottom surface of the sealing member 5. The sealing member 5 can be made from resin material such as thermosetting resin, and specific examples of resin include epoxy resin, maleimide resin, and cyanate resin.

Figure 2:
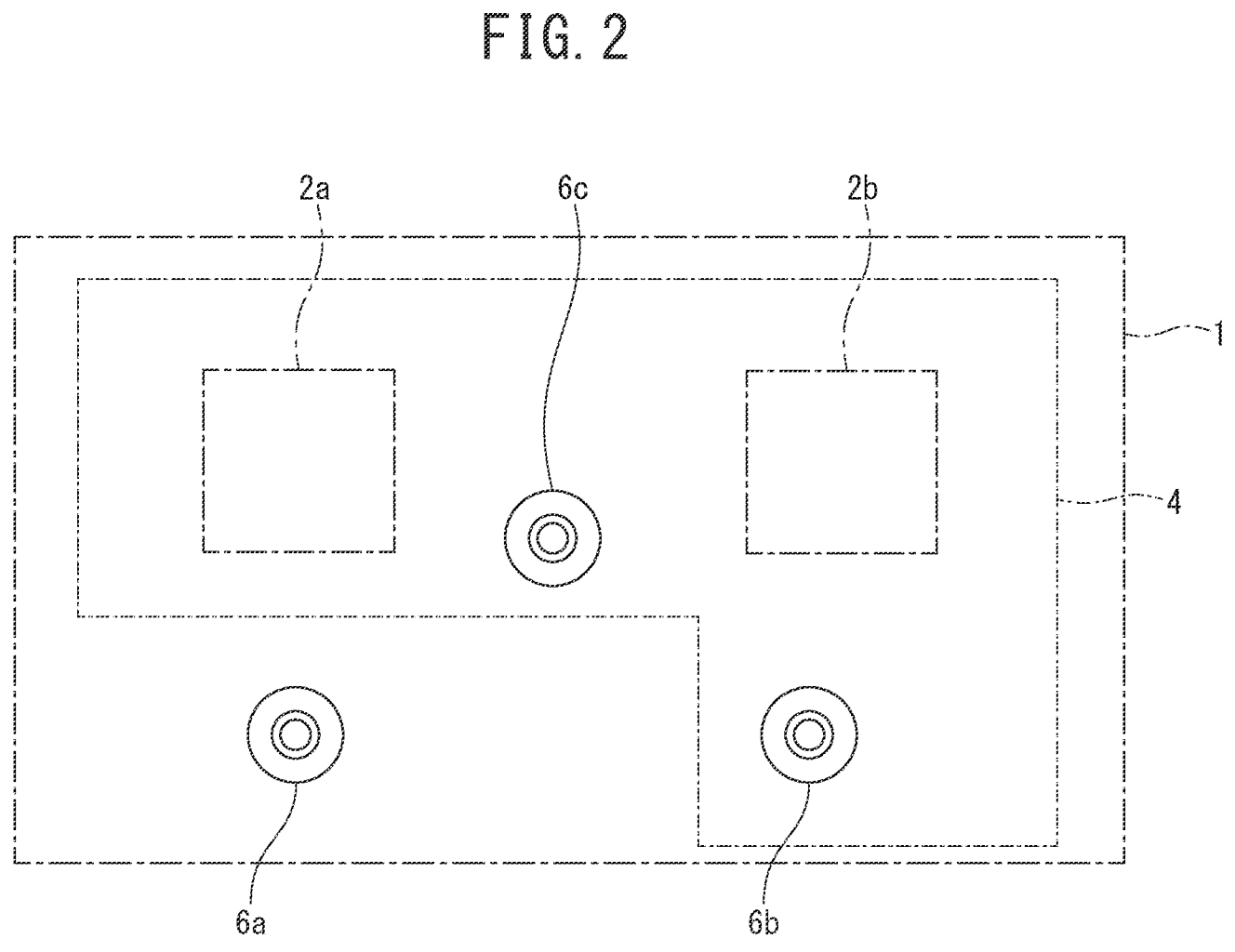

FIG. 2 is a plan view illustrating the semiconductor device according to the first embodiment. FIG. 2 indicates the drain-side terminal 6*a*, the source-side terminal 6*b*, and the output terminal 6*c* by the solid lines, and schematically indicates the outlines of the respective planar patterns of the insulated circuit substrate 1, the respective semiconductor chips 2*a* and 2*b*, and the printed wiring board 4 by the dash-dotted lines, while FIG. 2 omits the illustration of the sealing member 5.

As illustrated in FIG. 2, the insulated circuit substrate 1 and the semiconductor chips 2*a* and 2*b* each have a rectangular planar pattern. The printed wiring board 4 has an L-shaped planar pattern, but is not limited to this case, and may have a rectangular planar pattern, for example. The drain-side terminal 6*a* and the source-side terminal 6*b* are arranged next to each other along one side of the rectangular planar pattern of the insulated circuit substrate 1 in the longitudinal direction. The output terminal 6*c* is located substantially in the middle of the rectangular planar pattern of the insulated circuit substrate 1. The respective arranged positions of the drain-side terminal 6*a*, the source-side terminal 6*b*, and the output terminal 6*c* may be changed as appropriate.

Figure 4:
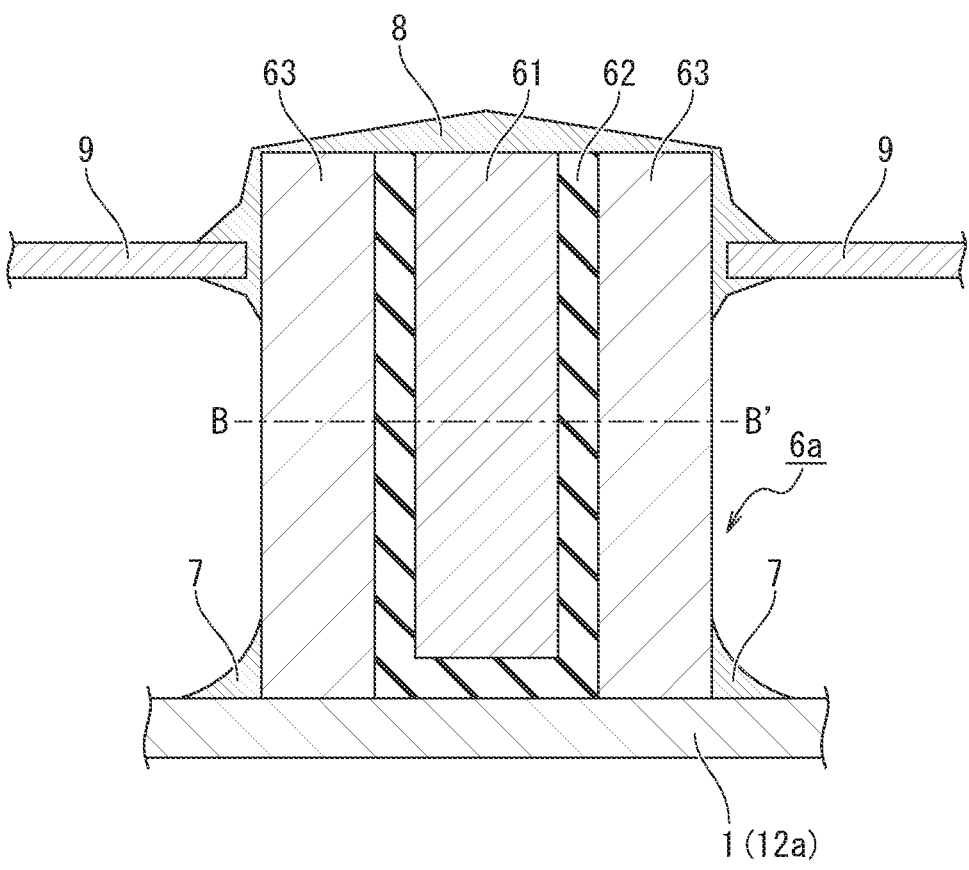
FIG. 4 is a vertical cross-sectional view illustrating the external connection terminal of the semiconductor device according to the first embodiment.

FIG. 3 is a horizontal cross-sectional view of the drain-side terminal 6*a* illustrated in FIG. 1 and FIG. 2. FIG. 4 is a vertical cross-sectional view of the drain-side terminal 6*a* taken along line A-A' in FIG. 3. FIG. 4 schematically indicates the drain-side terminal 6*a* having a greater width and a shorter length than that illustrated in FIG. 1.

As illustrated in FIG. 3 and FIG. 4, the drain-side terminal 6a has a concentric-type terminal structure including an inner-side conductor layer 61, an insulating layer 62 provided at the circumference of the inner-side conductor layer 61, and an outer-side conductor layer 63 provided at the circumference of the insulating layer 62. The inner-side conductor layer 61, the insulating layer 62, and the outer-side conductor layer 63 are arranged to be concentric with each other. The inner-side conductor layer 61 has a round columnar shape. The insulating layer 62 has a cylindrical shape so as to surround the outer circumference of the inner-side conductor layer 61. The outer-side conductor layer 63 has a cylindrical shape so as to further surround the outer circumference of the insulating layer 62.

The inner-side conductor layer 61 and the outer-side conductor layer 63 are each made from conductive material of metal such as copper (Cu), a Cu alloy mainly containing Cu, aluminum (Al), and an aluminum alloy mainly containing Al. The inner-side conductor layer 61 and the outer-side conductor layer 63 may be made from either the same material or different kinds of material.

The insulating layer 62 is made from insulating material of resin such as polyethylene, Teflon (registered trademark), and polyimide. The insulating layer 62 has a function of insulating the inner-side conductor layer 61 and the outer-side conductor layer 63 from each other. The insulating layer 62 is provided to cover the lower end of the inner-side conductor layer 61 in order to prevent a current from flowing through the inner-side conductor layer 61. The lower end of the outer-side conductor layer 63 is bonded to the upper-side conductor layer 12a with bonding material 7 such as solder. The outer-side conductor layer 63 is electrically connected to the upper-side conductor layer 12a.

The upper end of the drain-side terminal 6a is inserted to a penetration hole of a printed wiring board (a drive circuit substrate) 9 as an external element of the semiconductor device according to the first embodiment so as to be bonded to the printed wiring board 9 with a bonding material 8 such as solder. The printed wiring board 9 is a substrate that drives the semiconductor chips 2a and 2b and is different from the printed wiring board 4 illustrated in FIG. 1. The printed wiring board 9 is provided at a position over the printed wiring board 4 and is located on the outer side of the sealing member 5. The semiconductor device according to the first embodiment may include the printed wiring board 9 as an internal element. The upper end of the inner-side conductor layer 61 is not covered with the insulating layer 62 so as to be exposed outward. The inner-side conductor layer 61 and the outer-side conductor layer 63 are electrically connected to each other via the bonding material 8 such as solder. This structure can prevent the inner-side conductor layer 61 from being led to be a floating potential.

Figure 5:
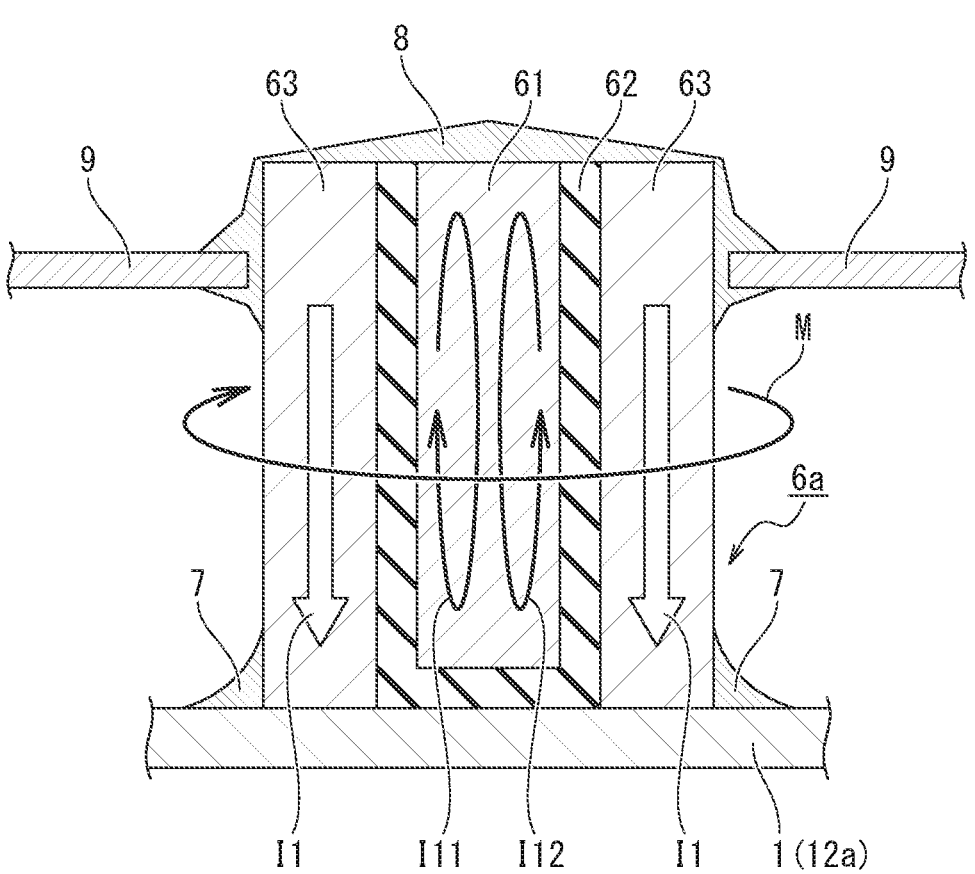
FIG. 5 is another vertical cross-sectional view illustrating the external connection terminal of the semiconductor device according to the first embodiment.

Upon the switching operation of the semiconductor device according to the first embodiment, a current I1 flows through the outer-side conductor layer 63 of the drain-side terminal 6a from the upper side to the lower side, as schematically indicated in FIG. 5. A magnetic field M is caused by the Ampere's circuital law around the current I1 flowing through the outer-side conductor layer 63. The magnetic field M is caused in the clockwise direction as viewed from the upper side to the lower side of the drain-side terminal 6a.

At this point, eddy currents I11 and I12 are caused in the inner-side conductor layer 61 in a direction of suppressing the magnetic field M by the Lenz's law. The eddy currents I11 and I12 flow in a whirl about the central part of the inner-side conductor layer 61 from the upper side to the lower side and around the circumference of the inner-side conductor layer 61 from the lower side to the upper side. These eddy currents I11 and I12 offset to decrease the magnetic field M around the drain-side terminal 6a. This reduces the parasitic inductance of the drain-side terminal 6a itself and the parasitic inductance of the entire conversion circuit unit, so as to suppress the induced voltage upon the switching operation.

The source-side terminal 6b and the output terminal 6c illustrated in FIG. 1 have the same structure as the drain-side terminal 6a illustrated in FIG. 3 and FIG. 4. The plural gate control terminals and the plural auxiliary source terminals (not illustrated) may also have the same structure as the drain-side terminal 6a illustrated in FIG. 3 and FIG. 4. All of the "external connection terminals" in the semiconductor device according to the first embodiment do not necessarily have the same structure as the drain-side terminal 6a illustrated in FIG. 3 and FIG. 4, and some of the "external connection terminals" in the semiconductor device according to the first embodiment may have a single-layer structure including copper (Cu), for example.

Figure 6:
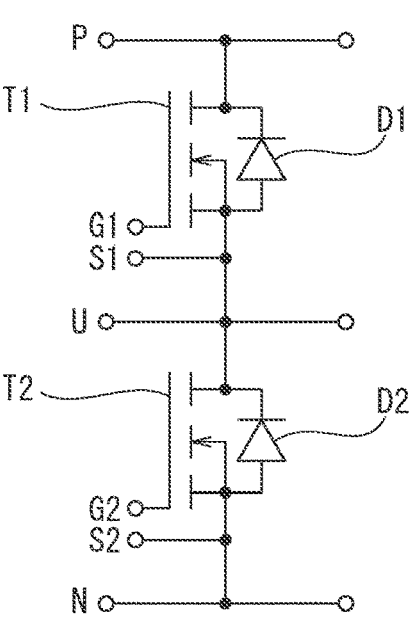
FIG. 6 is an equivalent circuit diagram of the semiconductor device according to the first embodiment.

FIG. 6 is an example of an equivalent circuit diagram of the semiconductor device according to the first embodiment. As illustrated in FIG. 6, the semiconductor device according to the first embodiment implements a part of a three-phase bridge circuit.

A second main electrode (a drain electrode) of a transistor T1 on the upper arm side is connected to a drain-side terminal P, and a first main electrode (a source electrode) of a transistor T2 on the lower arm side is connected to a source-side terminal N. A source electrode of the transistor T1 and a drain electrode of the transistor T2 are connected to an output terminal U and an auxiliary source terminal S1. An auxiliary source terminal S2 is connected to the source electrode of the transistor T2. Gate control terminals G1 and G2 are connected to gate electrodes of the transistors T1 and T2 respectively. Body diodes D1 and D2 each serving as a freewheeling diode (FWD) are connected in antiparallel to and installed in the transistors T1 and T2.

The drain-side terminal P, the source-side terminal N, and the output terminal U illustrated in FIG. 6 correspond to the drain-side terminal 6a, the source-side terminal 6b, and the output terminal 6c illustrated in FIG. 1, respectively. The transistors T1 and T2 illustrated in FIG. 6 correspond to the semiconductor chips 2a and 2b illustrated in FIG. 1, respectively. FIG. 1 omits the illustration of the gate control terminals G1 and G2 and the auxiliary source terminals S1 and S2 illustrated in FIG. 6.

The operations of the semiconductor device according to the first embodiment are described below. A control signal for controlling the ON/OFF state of the respective semiconductor chips 2a and 2b is applied to the respective gate electrodes of the semiconductor chips 2a and 2b via the printed wiring board 4 and the post electrodes 3a and 3b through the gate control terminals (not illustrated) so as to lead the semiconductor chips 2a and 2b to alternately execute the switching operation.

The arrows I1 to I6 illustrated in FIG. 1 schematically indicate the respective current paths in the semiconductor device according to the first embodiment. The current (indicated by the arrow I1) entering from the drain-side terminal 6a flows to the respective post electrodes 3a via the semiconductor chip 2a on the upper arm side through the upper-side conductor layer 12a of the insulated circuit substrate 1 (indicated by the arrow I2), and further flows to the external circuit through the output terminal 6c via the printed wiring board 4 (indicated by the arrow I3). The

9 current (indicated by the arrow 14) entering the output terminal 6c from the external circuit flows to the respective post electrodes 3b via the semiconductor chip 2b on the lower arm side through the upper-side conductor layer 12b of the insulated circuit substrate 1 (indicated by the arrow 15), and further flows to the external circuit through the source-side terminal 6b via the printed wiring board 4 (indicated by the arrow I6).

Upon the switching operation of the semiconductor device according to the first embodiment, an induced electromotive force ΔV as given by the following formula (1) is generated in the semiconductor chips 2a and 2b.

$$\Delta V = Ls \times di/dt \tag{1}$$

In the formula (1), Ls is a parasitic inductance of the conversion circuit unit in the power conversion device. The parasitic inductance is present inside an input capacitor, inside the semiconductor module, and in a connection wire between the input capacitor and the semiconductor module. In the formula (1), di/dt is a rate of change in current upon the switching operation. The extra induced electromotive force ΔV given by the formula (1) is applied as a surge voltage to the semiconductor chips 2a and 2b, in addition to a DC voltage of the circuit. A rated voltage of the semiconductor chips 2a and 2b needs to be set, including the surge voltage, so as not to exceed a breakdown voltage.

In the conventional case in which the drain-side terminal 6a, the source-side terminal 6b, and the output terminal 6c each have the single-layer structure including copper (Cu), a proportion of the parasitic inductance of the drain-side terminal 6a, the source-side terminal 6b, and the output terminal 6c themselves to the parasitic inductance of the entire current paths I1 to I6 is inevitably increased, since the drain-side terminal 6a, the source-side terminal 6b, and the output terminal 6c are long, which limits the regulation of the induced voltage upon the switching operation.

As compared with the conventional case, the semiconductor device according to the first embodiment including the drain-side terminal 6a, which has the structure of including the inner-side conductor layer 61, the insulating layer 62, and the outer-side conductor layer 63, causes the eddy currents I11 I12 in the inner-side conductor layer 61, so as to offset to decrease the magnetic field M around the drain-side terminal 6a, as schematically indicated in FIG. 5. The structure of the other external connection terminals such as the source-side terminal 6b and the output terminal 6c, which is the same as that of the drain-side terminal 6a, can also reduce the parasitic inductance of the external connection terminals themselves such as the drain-side terminal 6a, the source-side terminal 6b, and output terminal 6c and the parasitic inductance of the entire conversion circuit unit, so as to suppress the induced voltage upon the switching operation.

An example of a method of manufacturing (a method of assembling) the semiconductor device according to the first embodiment is described below. First, the drain-side terminal 6a illustrated in FIG. 3 and FIG. 4 is prepared. The drain-side terminal 6a can be prepared such that liquid resin is poured into the cylindrical outer-side conductor layer 63, and the inner-side conductor layer 61 is then inserted so as to solidify the resin to provide the insulating layer 62, for example. Alternatively, the drain-side terminal 6a may be prepared such that the inner-side conductor layer 61 preliminarily covered with the insulating layer 62 is inserted into the cylindrical outer-side conductor layer 63. The source-side terminal 6b and the output terminal 6c having the same structure as the drain-side terminal 6a are also prepared in the same manner.

The insulated circuit substrate 1 illustrated in FIG. 1 is also prepared, and the semiconductor chips 2a and 2b are then deposited on the upper-side conductor layers 12a and 12b of the insulated circuit substrate 1 via bonding material. Next, the post electrodes 3a and 3b are deposited on the semiconductor chips 2a and 2b via bonding material, and the printed wiring board 4 is further deposited on the post electrodes 3a and 3b via bonding material.

Next, the respective lower ends of the drain-side terminal 6a and the output terminal 6c are mounted on the upper-side conductor layers 12a and 12b of the insulated circuit substrate 1 via bonding material, and the lower end of the source-side terminal 6b is mounted on the upper-side wiring layer 42 of the printed wiring board 4 via bonding material.

Next, the insulated circuit substrate 1, the semiconductor chips 2a and 2b, the post electrodes 3a and 3b, and the printed wiring board 4 are bonded to each other by heat treatment. Thereafter, the semiconductor chips 2a and 2b, the post electrodes 3a and 3b, and the printed wiring board 4 are sealed with the sealing member 5. The semiconductor device according to the first embodiment illustrated in FIG. 1 is thus completed.

Figure 7:
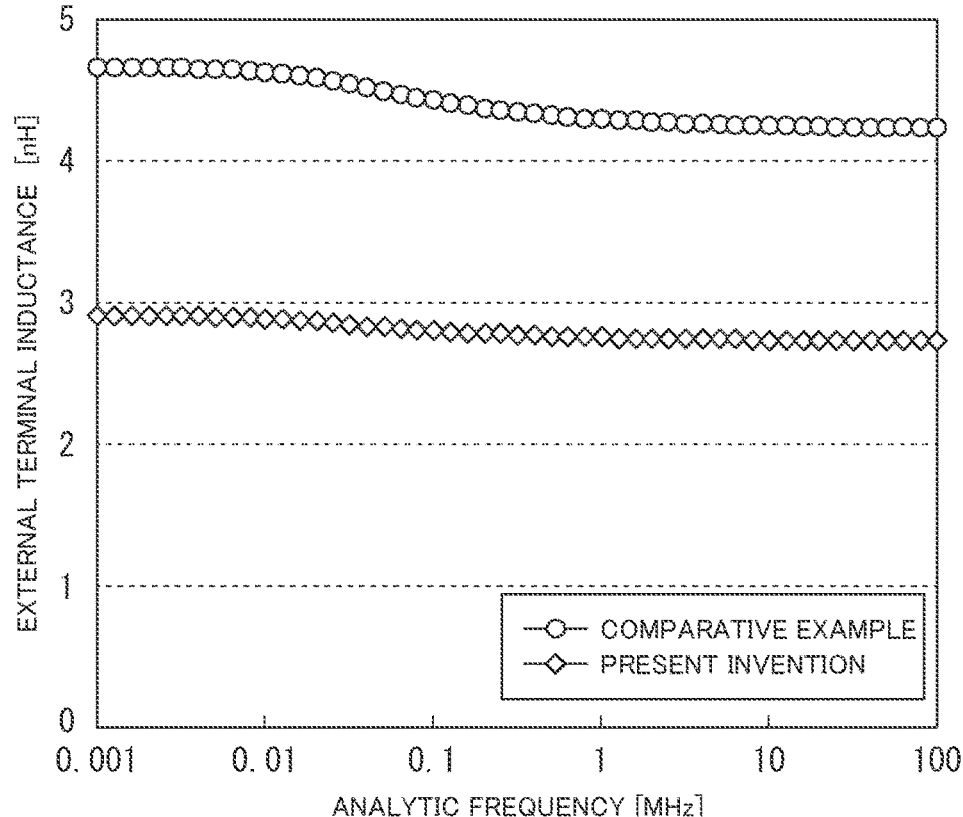
FIG. 7 is a graph showing a relation between an analytic frequency and an inductance in each of the semiconductor device according to the first embodiment and a comparative example.

FIG. 7 shows the simulation results of a frequency dependence of the inductance between the drain-side terminal 6a and the source-side terminal 6b in each of the semiconductor device according to the first embodiment and a semiconductor device of a comparative example. The semiconductor device according to the first embodiment used in this simulation includes the drain-side terminal 6a, the source-side terminal 6b, and the output terminal 6c each having the structure as illustrated in FIG. 3 and FIG. 4, and the semiconductor device of the comparative example used in this simulation includes the drain-side terminal 6a, the source-side terminal 6b, and the output terminal 6c each having a single-layer structure.

The indication "PRESENT INVENTION" in FIG. 7 corresponds to the simulation results of the semiconductor device according to the first embodiment, and the indication "COMPARATIVE EXAMPLE" corresponds to the semiconductor device of the comparative example. The simulation results revealed, as shown in FIG. 7, that the inductance between the drain-side terminal 6a and the source-side terminal 6b in the semiconductor device according to the first embodiment is reduced much further than that of the semiconductor device of the comparative example.

As described above, the semiconductor device according to the first embodiment, in which the external connection terminals such as the drain-side terminal 6a have the structure including the inner-side conductor layer 61, the insulating layer 62, and the outer-side conductor layer 63, can decrease the magnetic field M caused by the current I1 due to the eddy currents I11 and I12. The semiconductor device according to the first embodiment thus can reduce the parasitic inductance in the respective external connection terminals such as the drain-side terminal 6a themselves and the parasitic inductance in the paths of the entire conversion circuit unit, so as to suppress the induced voltage upon the switching operation.

Second Embodiment

Figure 8:
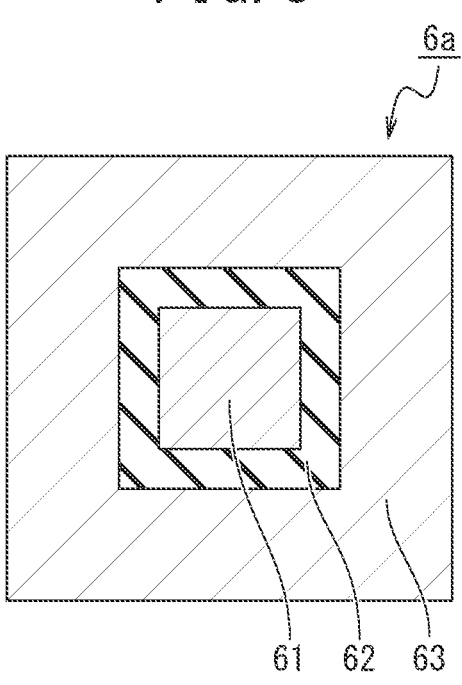
FIG. 8 is a horizontal cross-sectional view illustrating an external connection terminal of a semiconductor device according to a second embodiment.

FIG. 8 is a horizontal cross-sectional view of the drain-side terminal 6a in a semiconductor device according to a second embodiment, and corresponds to the horizontal cross-sectional view of the drain-side terminal 6a in the semiconductor device according to the first embodiment illustrated in FIG. 3. As illustrated in FIG. 8, the semiconductor device according to the second embodiment differs from the semiconductor device according to the first embodiment illustrated in FIG. 3 in that the drain-side terminal 6a has a rectangular columnar shape (a quadrangular columnar shape).

The drain-side terminal 6a includes the inner-side conductor layer 61 having a rectangular columnar shape (the quadrangular columnar shape), the insulating layer 62 having a square tubular shape provided to surround the circumference of the inner-side conductor layer 61, and the outer-side conductor layer 63 having a square tubular shape provided to surround the circumference of the insulating layer 62. The cross-sectional shape of each of the inner-side conductor layer 61 and the entire drain-side terminal 6a is a regular square or a rectangle. The cross-sectional shape of each of the inner-side conductor layer 61 and the entire drain-side terminal 6a may be a triangle or a polygonal shape such as a five-sided shape or a shape having more sides. The vertical cross section of the drain-side terminal 6a is common to FIG. 4. The other configurations of the semiconductor device according to the second embodiment are the same as those of the semiconductor device according to the first embodiment, and overlapping explanations are not repeated below.

The semiconductor device according to the second embodiment, in which the external connection terminals such as the drain-side terminal 6a have the structure including the inner-side conductor layer 61, the insulating layer 62, and the outer-side conductor layer 63, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment.

Third Embodiment

Figure 9:
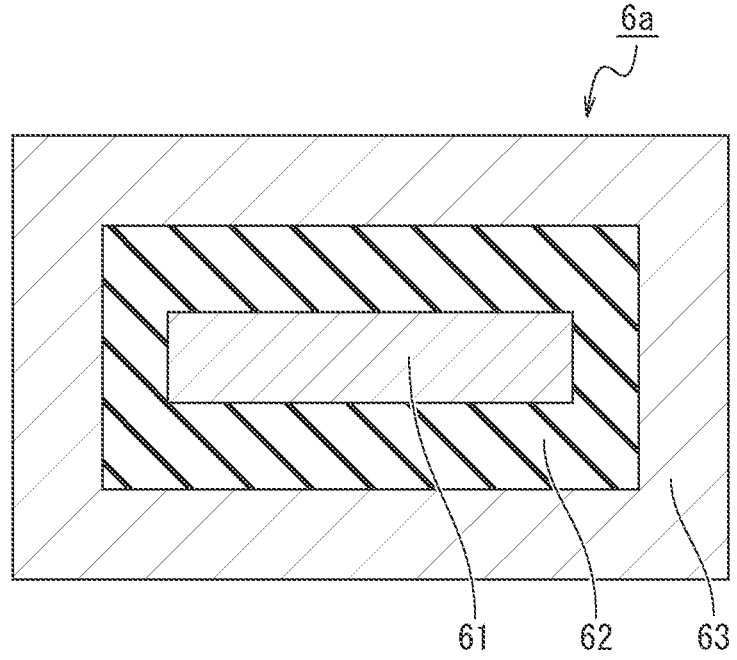
FIG. 9 is a horizontal cross-sectional view illustrating an external connection terminal of a semiconductor device according to a third embodiment.

FIG. 9 is a horizontal cross-sectional view of the drain-side terminal 6a in a semiconductor device according to a third embodiment, and corresponds to the horizontal cross-sectional view of the drain-side terminal 6a in the semiconductor device according to the first embodiment illustrated in FIG. 3. As illustrated in FIG. 9, the semiconductor device according to the third embodiment differs from the semiconductor device according to the first embodiment illustrated in FIG. 3 in that the drain-side terminal 6a has a flat plate-like shape. The term "flat plate-like shape" as used herein refers to a shape having a pair of main surfaces opposed to each other and extending parallel to each other in one direction.

The drain-side terminal 6a includes the inner-side conductor layer 61 having a flat plate-like shape, the insulating layer 62 having a square tubular shape provided to surround the circumference of the inner-side conductor layer 61, and the outer-side conductor layer 63 having a square tubular shape provided to surround the circumference of the insulating layer 62. The vertical cross section of the drain-side terminal 6a is common to FIG. 4. The other configurations of the semiconductor device according to the third embodiment are the same as those of the semiconductor device according to the first embodiment, and overlapping explanations are not repeated below.

The semiconductor device according to the third embodiment, in which the external connection terminals such as the drain-side terminal 6a have the structure including the inner-side conductor layer 61, the insulating layer 62, and the outer-side conductor layer 63, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment.

Fourth Embodiment

Figure 10:
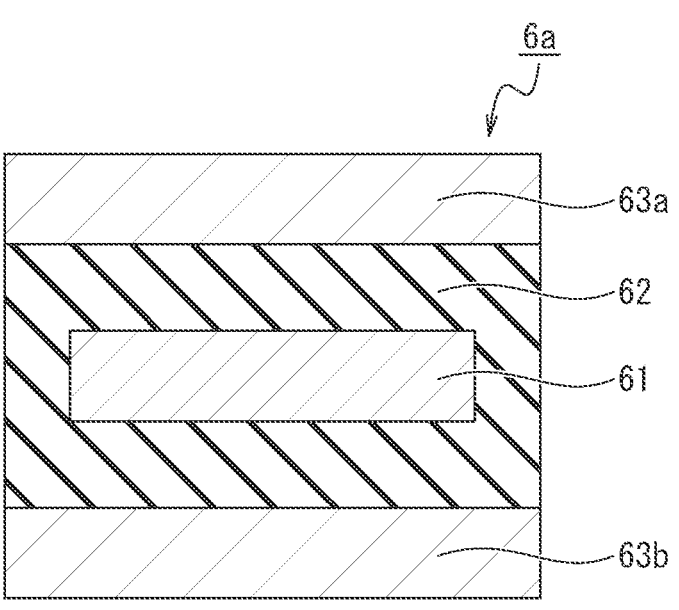
FIG. 10 is a horizontal cross-sectional view illustrating an external connection terminal of a semiconductor device according to a fourth embodiment.

FIG. 10 is a horizontal cross-sectional view of the drain-side terminal 6a in a semiconductor device according to a fourth embodiment, and corresponds to the horizontal cross-sectional view of the drain-side terminal 6a in the semiconductor device according to the first embodiment illustrated in FIG. 3. As illustrated in FIG. 10, the semiconductor device according to the fourth embodiment differs from the semiconductor device according to the first embodiment illustrated in FIG. 3 in that the drain-side terminal 6a has a flat plate-like shape, and in including the outer-side conductor layers 63a and 63b having a shape that is not a tubular shape.

The drain-side terminal 6a includes the inner-side conductor layer 61 having a flat plate-like shape, the insulating layer 62 having a square tubular shape provided to surround the circumference of the inner-side conductor layer 61, and the outer-side conductor layers 63a and 63b each having a flat plate-like shape and provided to be opposed to each other at the circumference of the insulating layer 62. The vertical cross section taken along the inner-side conductor layer 61, the insulating layer 62, and the outer-side conductor layers 63a and 63b is common to FIG. 4. The other configurations of the semiconductor device according to the fourth embodiment are the same as those of the semiconductor device according to the first embodiment, and overlapping explanations are not repeated below.

The semiconductor device according to the fourth embodiment, in which the external connection terminals such as the drain-side terminal 6a have the structure including the inner-side conductor layer 61, the insulating layer 62, and the outer-side conductor layers 63a and 63b, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment.

Fifth Embodiment

Figure 11:
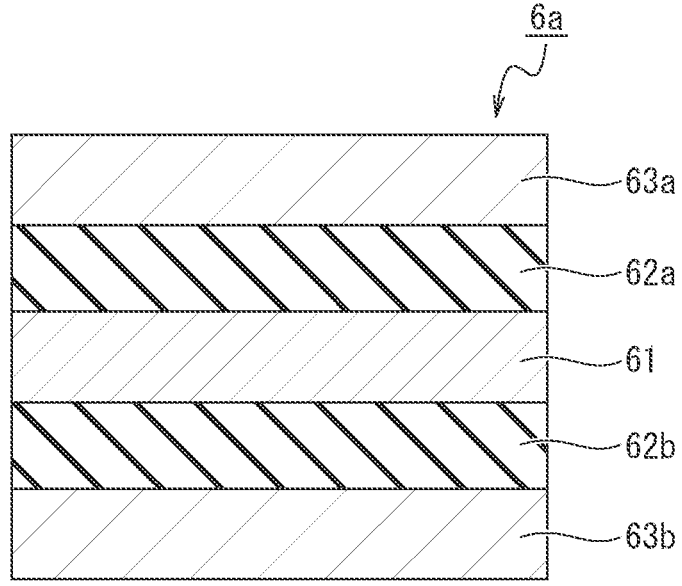
FIG. 11 is a horizontal cross-sectional view illustrating an external connection terminal of a semiconductor device according to a fifth embodiment.

FIG. 11 is a horizontal cross-sectional view of the drain-side terminal 6a in a semiconductor device according to a fifth embodiment, and corresponds to the horizontal cross-sectional view of the drain-side terminal 6a in the semiconductor device according to the first embodiment illustrated in FIG. 3. As illustrated in FIG. 11, the semiconductor device according to the fifth embodiment differs from the semiconductor device according to the first embodiment illustrated in FIG. 3 in that the drain-side terminal 6a has a flat plate-like shape, and in including the insulating layers 62a and 62b and the outer-side conductor layers 63a and 63b each having a shape that is not a tubular shape.

The drain-side terminal 6a includes the inner-side conductor layer 61 having a flat plate-like shape, the insulating layers 62a and 62b each having a flat plate-like shape and provided to be opposed to each other while interposing the paired main surfaces of the inner-side conductor layer 61 opposed to each other, and the outer-side conductor layers 63a and 63b each having a flat plate-like shape and provided to be opposed to each other while interposing the inner-side conductor layer 61 and the respective insulating layers 62a and 62b. Namely, the inner-side conductor layer 61, the insulating layers 62a and 62b, and the outer-side conductor layers 63a and 63b each having the flat plate-like shape are provided to be stacked together. The vertical cross section in the stacked direction of the inner-side conductor layer 61, the insulating layers 62a and 62b, and the outer-side conductor layers 63a and 63b is common to FIG. 4. The other configurations of the semiconductor device according to the fifth embodiment are the same as those of the semiconductor device according to the first embodiment, and overlapping explanations are not repeated below.

The semiconductor device according to the fifth embodiment, in which the external connection terminals such as the drain-side terminal 6a have the structure including the inner-side conductor layer 61, the insulating layers 62a and 62b, and the outer-side conductor layers 63a and 63b, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment. Further, the inner-side conductor layer 61, the insulating layers 62a and 62b, and the outer-side conductor layers 63a and 63b only need to be stacked and attached to one another to achieve the structure described above, so as to facilitate the manufacture of the external connection terminals such as the drain-side terminal 6a.

Sixth Embodiment

Figure 12:
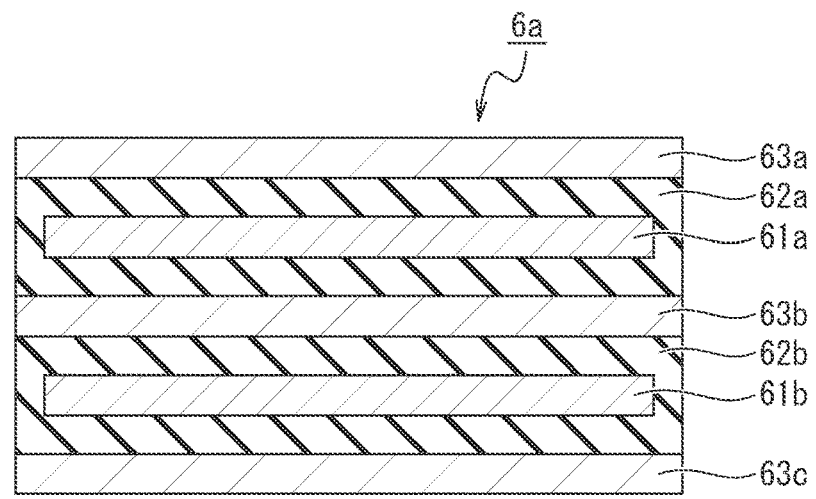
FIG. 12 is a horizontal cross-sectional view illustrating an external connection terminal of a semiconductor device according to a sixth embodiment.

FIG. 12 is a horizontal cross-sectional view of the drain-side terminal 6a in a semiconductor device according to a sixth embodiment, and corresponds to the horizontal cross-sectional view of the drain-side terminal 6a in the semiconductor device according to the first embodiment illustrated in FIG. 3. As illustrated in FIG. 12, the semiconductor device according to the sixth embodiment differs from the semiconductor device according to the first embodiment illustrated in FIG. 3 in that the drain-side terminal 6a has a structure with more layers.

The drain-side terminal 6a includes the inner-side conductor layers 61a and 61b each having a flat plate-like shape, the insulating layers 62a and 62b each having a square tubular shape and provided to surround the circumference of the respective inner-side conductor layers 61a and 61b, and the outer-side conductor layers 63a, 63b, and 63c each having a flat plate-like shape and provided at the circumference of the respective insulating layers 62a and 62b. The inner-side conductor layer 61a and the insulating layer 62a are interposed between the outer-side conductor layer 63a and the outer-side conductor layer 63b. The inner-side conductor layer 61b and the insulating layer 62b are interposed between the outer-side conductor layer 63b and the outer-side conductor layer 63c.

Although not illustrated, the respective lower ends of the inner-side conductor layers 61a and 61b are covered with the respective insulating layers 62a and 62b so as not to lead a current to flow through the respective inner-side conductor layers 61a and 61b. The respective lower ends of the outer-side conductor layers 63a, 63b, and 63c are bonded to the upper-side conductor layer 12a so as to lead a current to flow through the respective outer-side conductor layers 63a, 63b, and 63c. The insulating layers 62a and 62b do not necessarily have the square tubular shape but may be separated from each other so as to be opposed to each other to interpose a pair of the main surfaces of the respective inner-side conductor layers 61a and 61b. The other configurations of the semiconductor device according to the sixth embodiment are the same as those of the semiconductor device according to the first embodiment, and overlapping explanations are not repeated below.

The semiconductor device according to the sixth embodiment, in which the external connection terminals such as the drain-side terminal 6a have the structure including the inner-side conductor layers 61a and 61b, the insulating layers 62a and 62b, and the outer-side conductor layers 63a, 63b, and 63c, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment. Further, the drain-side terminal 6a that has the multiple-layered structure can increase the current capacity.

Seventh Embodiment

Figure 13:
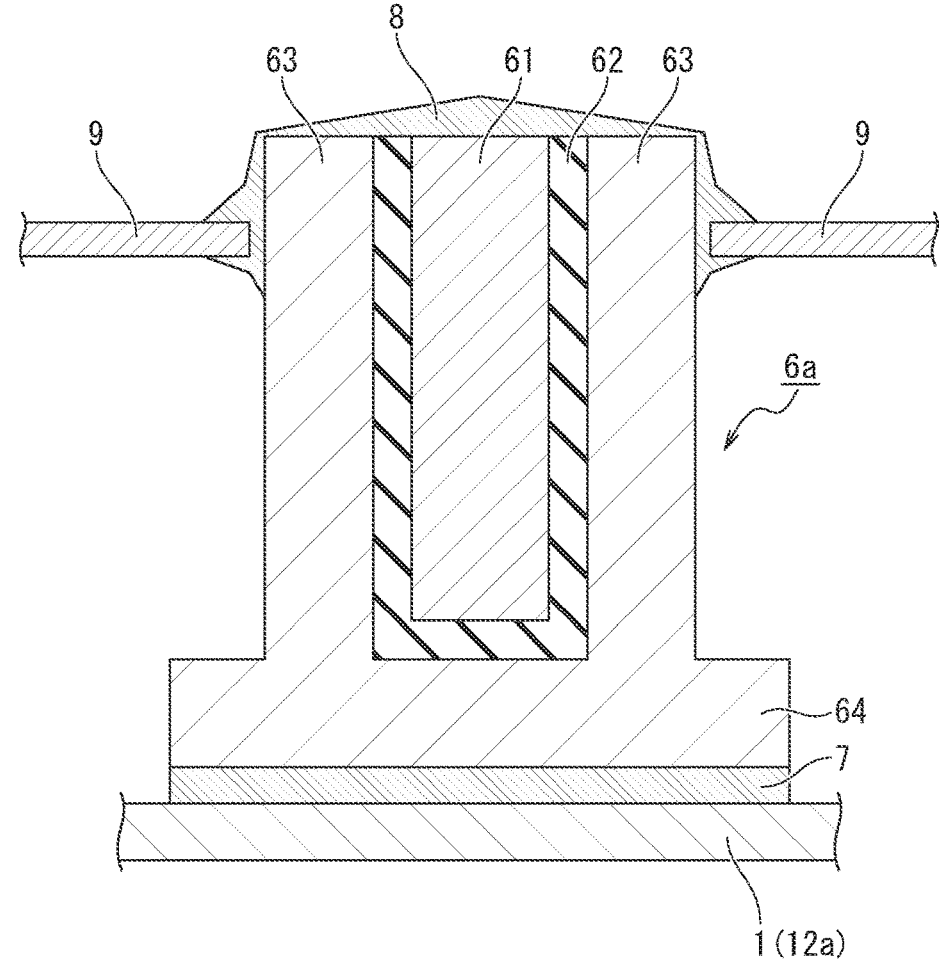
FIG. 13 is a vertical cross-sectional view illustrating an external connection terminal of a semiconductor device according to a seventh embodiment.

FIG. 13 is a vertical cross-sectional view of the drain-side terminal 6a in a semiconductor device according to a seventh embodiment, and corresponds to the vertical cross-sectional view of the drain-side terminal 6a in the semiconductor device according to the first embodiment illustrated in FIG. 4. As illustrated in FIG. 13, the semiconductor device according to the seventh embodiment differs from the semiconductor device according to the first embodiment illustrated in FIG. 4 in that the drain-side terminal 6a further includes a lower conductor layer 64 provided at the respective lower ends of the inner-side conductor layer 61, the insulating layer 62, and the outer-side conductor layer 63.

The lower conductor layer 64 is made from conductive material of metal such as copper (Cu), a Cu alloy mainly containing Cu, aluminum (Al), and an aluminum alloy mainly containing Al. The lower conductor layer 64 may be formed integrally with the outer-side conductor layer 63. The lower conductor layer 64 has a greater width than the outer diameter of the outer-side conductor layer 63. The bottom surface of the lower conductor layer 64 is bonded to the upper-side conductor layer 12a via bonding material 7 such as solder or sintered material. The other configurations of the semiconductor device according to the seventh embodiment are the same as those of the semiconductor device according to the first embodiment, and overlapping explanations are not repeated below.

The semiconductor device according to the seventh embodiment, in which the external connection terminals such as the drain-side terminal 6a have the structure including the inner-side conductor layer 61, the insulating layer 62, and the outer-side conductor layer 63, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment. Further, the provision of the lower conductor layer 64 can facilitate the bonding step by use of the bonding material 7 of the sintered material by heating and pressure application.

Eighth Embodiment

Figure 14:
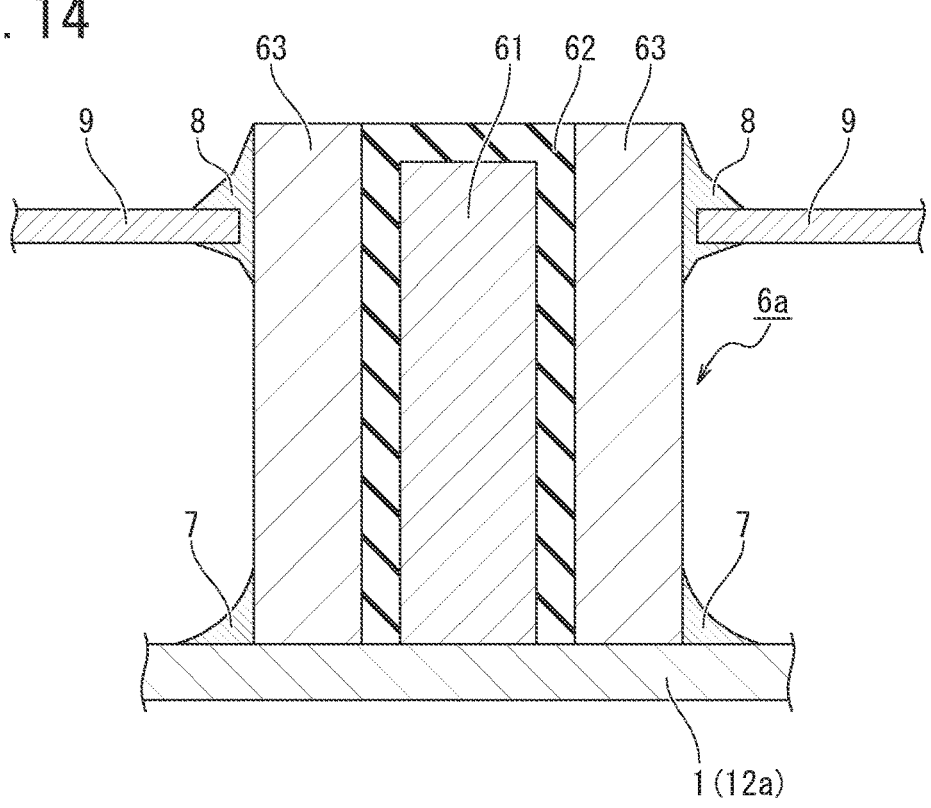
FIG. 14 is a vertical cross-sectional view illustrating an external connection terminal of a semiconductor device according to an eighth embodiment.

FIG. 14 is a vertical cross-sectional view of the drain-side terminal 6a in a semiconductor device according to an eighth embodiment, and corresponds to the vertical cross-sectional view of the drain-side terminal 6a in the semiconductor device according to the first embodiment illustrated in FIG. 4. As illustrated in FIG. 14, the semiconductor device according to the eighth embodiment differs from the semiconductor device according to the first embodiment illustrated in FIG. 4 in that the upper end of the inner-side conductor layer 61 of the drain-side terminal 6a is covered with the insulating layer 62.

The inner-side conductor layer 61 and the outer-side conductor layer 63 are electrically insulated from each other on the upper side of the drain-side terminal 6a. The lower end of the inner-side conductor layer 61 is not covered with the insulating layer 62 so as to be in contact with the upper-side conductor layer 12a. The inner-side conductor layer 61 is electrically connected to the outer-side conductor layer 63 via the upper-side conductor layer 12a. The other configurations of the semiconductor device according to the eighth embodiment are the same as those of the semiconductor device according to the first embodiment, and overlapping explanations are not repeated below.

The semiconductor device according to the eighth embodiment, in which the external connection terminals such as the drain-side terminal 6a have the structure including the inner-side conductor layer 61, the insulating layer 62, and the outer-side conductor layer 63, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment.

Ninth Embodiment

Figure 15:
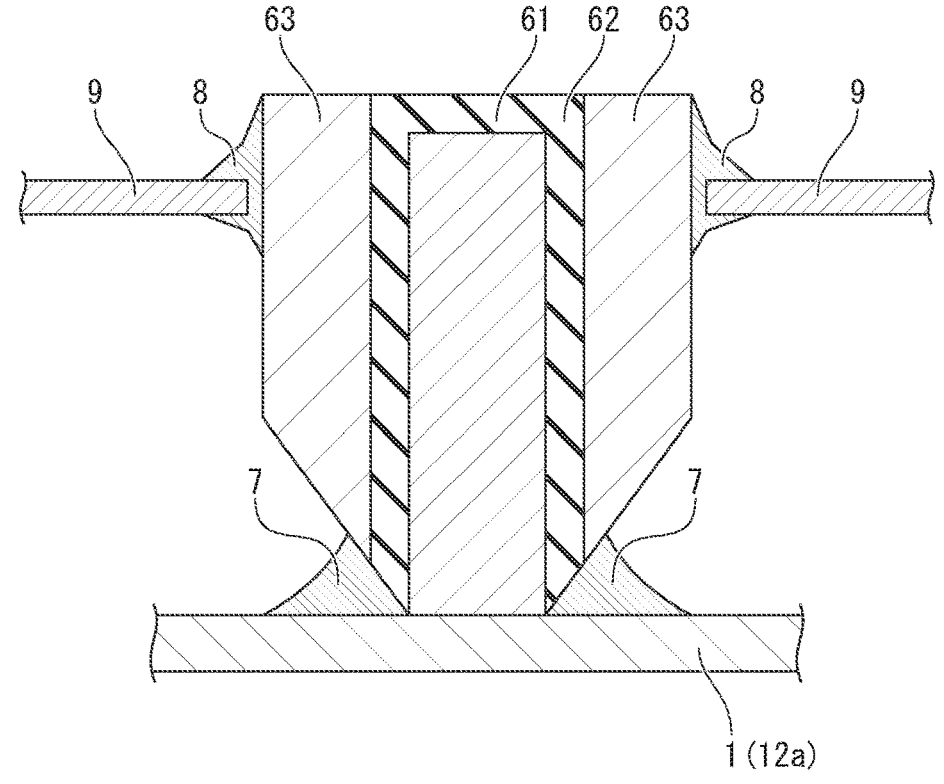
FIG. 15 is a vertical cross-sectional view illustrating an external connection terminal of a semiconductor device according to a ninth embodiment.

FIG. 15 is a vertical cross-sectional view of the drain-side terminal 6a in a semiconductor device according to a ninth embodiment, and corresponds to the vertical cross-sectional view of the drain-side terminal 6a in the semiconductor device according to the first embodiment illustrated in FIG. 4. As illustrated in FIG. 15, the semiconductor device according to the ninth embodiment differs from the semiconductor device according to the first embodiment illustrated in FIG. 4 in that the upper end of the inner-side conductor layer 61 of the drain-side terminal 6a is covered with the insulating layer 62, and the lower end of the drain-side terminal 6a has a tapered shape.

The inner-side conductor layer 61 and the outer-side conductor layer 63 are electrically insulated from each other on the upper side of the drain-side terminal 6a. The lower end of the inner-side conductor layer 61 is not covered with the insulating layer 62 so as to be in contact with the upper-side conductor layer 12a. The lower end of the inner-side conductor layer 61 may be in contact with the bonding material 7. The inner-side conductor layer 61 is electrically connected to the outer-side conductor layer 63 via the upper-side conductor layer 12a and the bonding material 7. The other configurations of the semiconductor device according to the ninth embodiment are the same as those of the semiconductor device according to the first embodiment, and overlapping explanations are not repeated below.

The semiconductor device according to the ninth embodiment, in which the external connection terminals such as the drain-side terminal 6a have the structure including the inner-side conductor layer 61, the insulating layer 62, and the outer-side conductor layer 63, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment.

Tenth Embodiment

Figure 16:
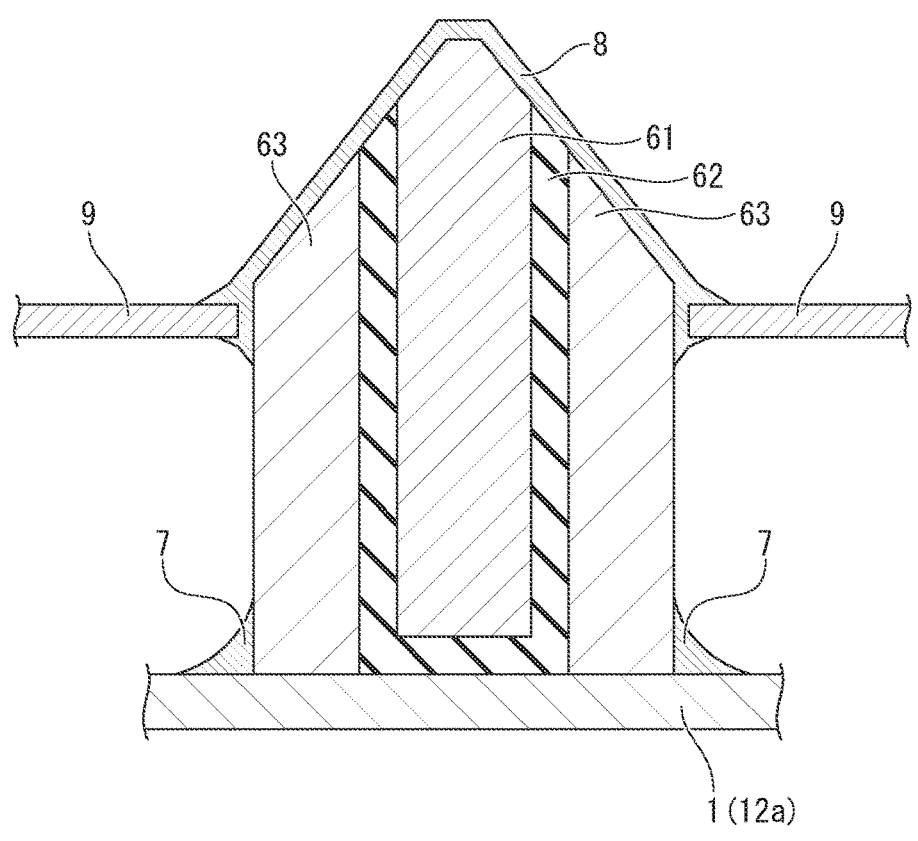
FIG. 16 is a vertical cross-sectional view illustrating an external connection terminal of a semiconductor device according to a tenth embodiment.

FIG. 16 is a vertical cross-sectional view of the drain-side terminal 6a in a semiconductor device according to a tenth embodiment, and corresponds to the vertical cross-sectional view of the drain-side terminal 6a in the semiconductor device according to the first embodiment illustrated in FIG. 4. As illustrated in FIG. 16, the semiconductor device according to the tenth embodiment differs from the semiconductor device according to the first embodiment illustrated in FIG. 4 in that the upper end of the drain-side terminal 6a has a tapered shape.

The inner-side conductor layer 61 is electrically connected to the outer-side conductor layer 63 via bonding material 8 such as solder on the upper side of the drain-side terminal 6a. The other configurations of the semiconductor device according to the tenth embodiment are the same as those of the semiconductor device according to the first embodiment, and overlapping explanations are not repeated below.

The semiconductor device according to the tenth embodiment, in which the external connection terminals such as the drain-side terminal 6a have the structure including the inner-side conductor layer 61, the insulating layer 62, and the outer-side conductor layer 63, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment.

Eleventh Embodiment

Figure 17:
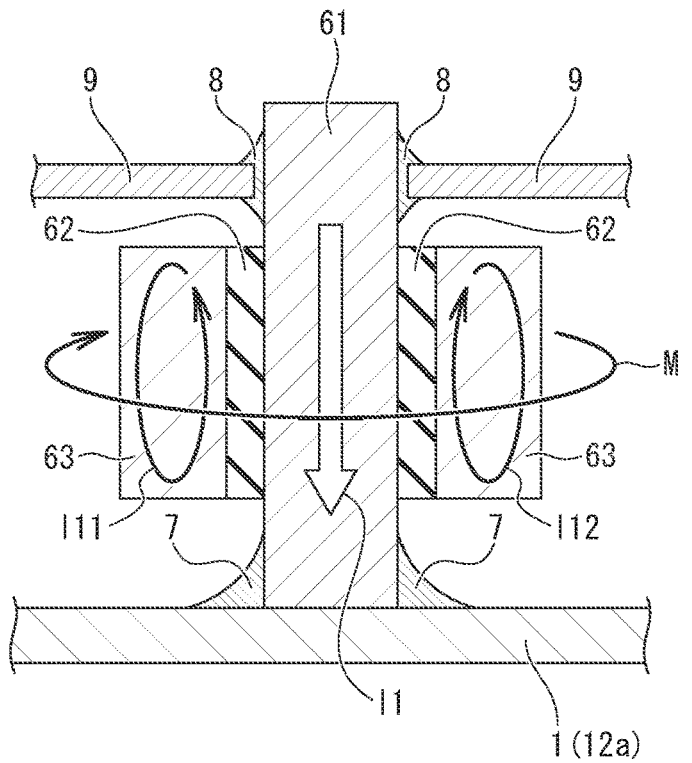
FIG. 17 is a vertical cross-sectional view illustrating an external connection terminal of a semiconductor device according to an eleventh embodiment.

FIG. 17 is a vertical cross-sectional view of the drain-side terminal 6a in a semiconductor device according to an eleventh embodiment, and corresponds to the vertical cross-sectional view of the drain-side terminal 6a in the semiconductor device according to the first embodiment illustrated in FIG. 4. As illustrated in FIG. 17, the semiconductor device according to the eleventh embodiment differs from the semiconductor device according to the first embodiment illustrated in FIG. 4 in that a current flows through the inner-side conductor layer 61 but is not led to flow through the outer-side conductor layer 63.

The outer-side conductor layer 63 has a shorter length than the inner-side conductor layer 61. The upper end of the outer-side conductor layer 63 is separated from the printed wiring board 9. The lower end of the outer-side conductor layer 63 is separated from the upper-side conductor layer 12a. The lower end of the inner-side conductor layer 61 is bonded to the upper-side conductor layer 12a via the bonding material 7. The upper end of the inner-side conductor layer 61 is bonded to the printed wiring board 9 via the bonding material 8.

As schematically illustrated in FIG. 17, the current I1 flows through the inner-side conductor layer 61 of the drain-side terminal 6a from the upper side to the lower side upon the switching operation of the semiconductor device according to the eleventh embodiment. The magnetic field M is caused by the Ampere's circuital law around the current I1 flowing through the inner-side conductor layer 61. The magnetic field M is caused in the clockwise direction as viewed from the upper side to the lower side of the drain-side terminal 6a. At this point, the eddy currents I11 and I12 are caused in the outer-side conductor layer 63 in a direction of suppressing the magnetic field M by the Lenz's law. The eddy currents I11 and I12 can offset to decrease the magnetic field M around the drain-side terminal 6a. The other configurations of the semiconductor device according to the eleventh embodiment are the same as those of the semiconductor device according to the first embodiment, and overlapping explanations are not repeated below.

The semiconductor device according to the eleventh embodiment, in which the external connection terminals such as the drain-side terminal 6a have the structure including the inner-side conductor layer 61, the insulating layer 62, and the outer-side conductor layer 63, can also reduce the parasitic inductance in the respective external connection terminals themselves and the parasitic inductance in the paths of the entire conversion circuit unit, so as to suppress the induced voltage upon the switching operation, as in the case of the semiconductor device according to the first embodiment.

Twelfth Embodiment

Figure 18:
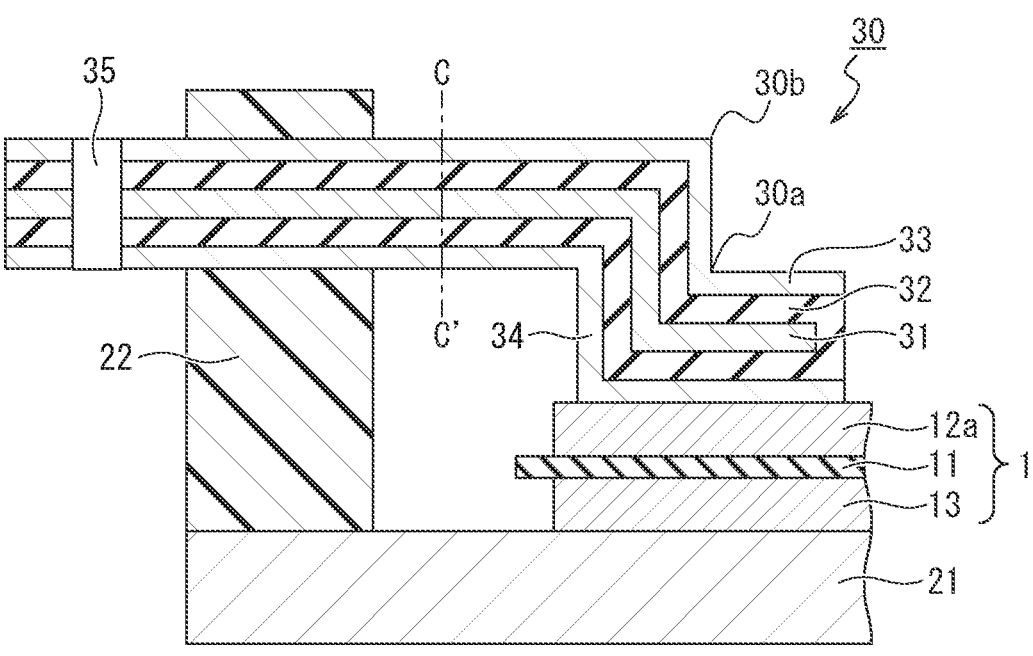
FIG. 18 is a cross-sectional view illustrating a semiconductor device according to a twelfth embodiment.

FIG. 18 is a cross-sectional view illustrating a part of a semiconductor device according to a twelfth embodiment. As illustrated in FIG. 18, the semiconductor device according to the twelfth embodiment differs from the semiconductor device according to the first embodiment illustrated in FIG. 1 in further including a cooling base 21 arranged on the bottom surface of the insulated circuit substrate 1 and a case 22 arranged on the cooling base 21 to house the insulated circuit substrate 1, and in that the external connection terminal 30 is formed integrally with the case 22.

Although not illustrated, the semiconductor chips 2a and 2b illustrated in FIG. 1 are arranged on the insulated circuit substrate 1. The external connection terminal 30 is electrically connected to the semiconductor chips 2a and 2b via the insulated circuit substrate 1. A sealing member (not illustrated) for sealing the insulated circuit substrate 1 and the semiconductor chips 2a and 2 is provided inside the case 22. The semiconductor device according to the twelfth embodiment does not necessarily include the printed wiring board 4 over the insulated circuit substrate 1 illustrated in FIG. 1.

The external connection terminal 30 has a flat plate-like shape, and is bent in a Z-shaped state so as to have bent parts 30a and 30b. The external connection terminal 30 is not necessarily bent but may extend straight in the horizontal direction. The external connection terminal 30 in such a case may be electrically connected to the insulated circuit substrate 1 via a conductive block, for example. The external connection terminal 30 implements any of the drain-side terminal, the source-side terminal, or the output terminal.

The external connection terminal 30 includes an inner-side conductor layer 31, an insulating layer 32 provided at the circumference of the inner-side conductor layer 31, and outer-side conductor layers 33 and 34 provided at the circumference of the insulating layer 32. The end part of the inner-side conductor layer 31 toward the insulated circuit substrate 1 is covered with the insulating layer 32 so as not to lead a current to flow through the inner-side conductor layer 31. The outer-side conductor layer 34 is bonded to the upper-side conductor layer 12a via bonding material such as solder (not illustrated) or by ultrasonic bonding. The external connection terminal 30 is provided with a penetration hole 35 on the outside of the case 22 for fastening the capacitor or the like with a bolt.

The cross section of the inner-side conductor layer 31, the insulating layer 32, and the outer-side conductor layers 33 and 34 taken along line C-C' in the stacking direction may be common to the cross section as illustrated in any of FIG. 9 to FIG. 11. The insulating layer 32 may have a tubular shape as in the case of the insulating layer 62 illustrated in FIG. 9 or FIG. 10, or may have a flat plate-like shape as in the case of the respective insulating layers 62a and 62b separated from each other toward the respective paired main surfaces of the inner-side conductor layer 31 as illustrated in FIG. 11. The outer-side conductor layers 33 and 34 may be integrated into a tubular state as in the case of the outer-side conductor layer 63 illustrated in FIG. 9, or may have a flat plate-like shape as in the case of the outer-side conductor layers 63a and 63b illustrated in FIG. 10 or FIG. 11.

The inner-side conductor layer 31 and the outer-side conductor layers 33 and 34 are made from conductive material of metal such as copper (Cu), a Cu alloy mainly containing Cu, aluminum (Al), and an aluminum alloy mainly containing Al. The insulating layer 32 is made of a flexible substrate including polyimide, for example.

Figure 19:
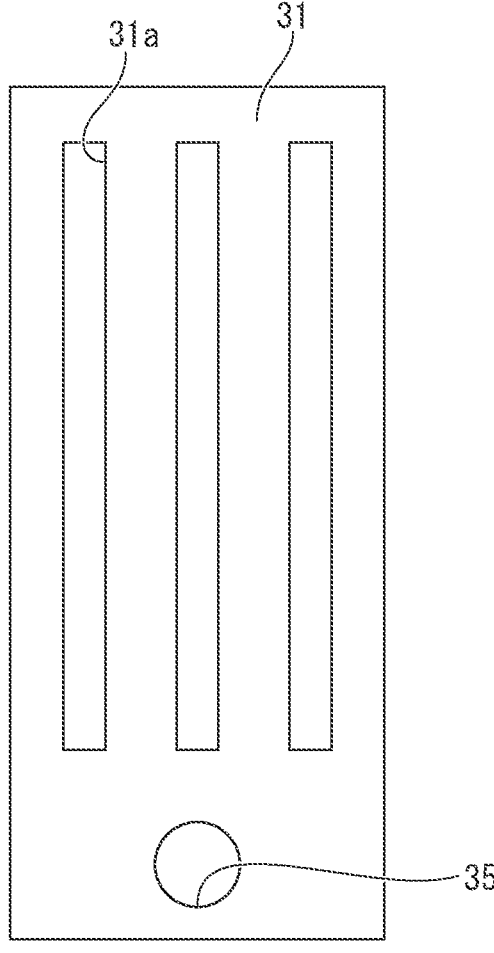
FIG. 19 is a plan view illustrating an inner-side conductor layer of the semiconductor device according to the twelfth embodiment.

FIG. 19 is a plan view illustrating an example of the inner-side conductor layer 31 before being bent in the Z-shaped state. As illustrated in FIG. 19, the inner-side conductor layer 31 may be provided with slits 31a. The number of the slits 31a can be determined as appropriate. Although not illustrated, the respective outer-side conductor layers 33 and 34 may also be provided with slits.

Figure 20:
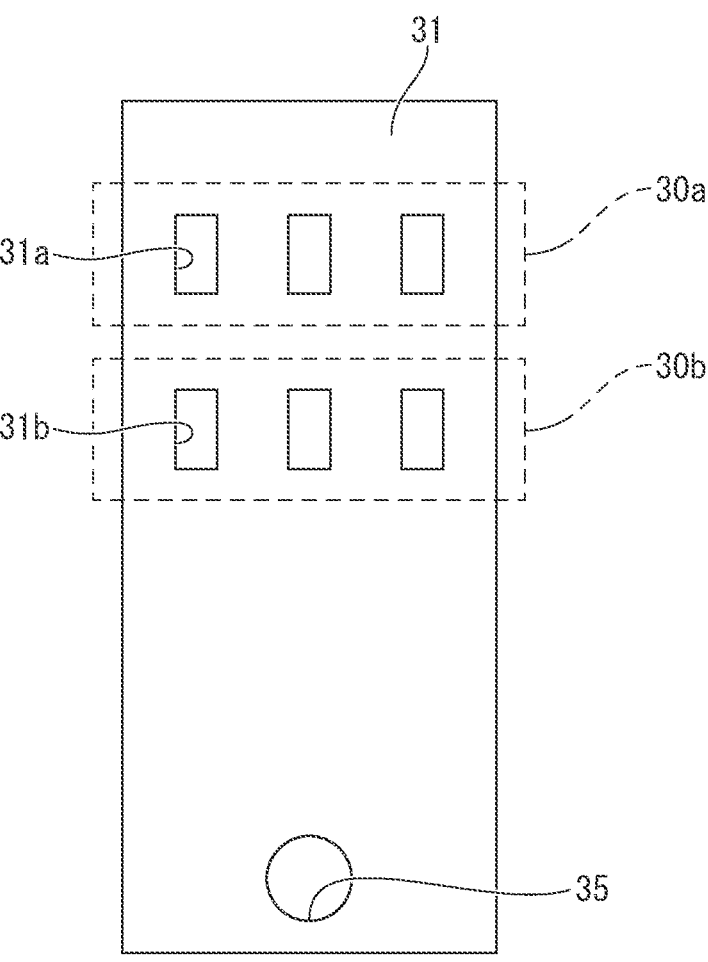
FIG. 20 is another plan view illustrating the inner-side conductor layer of the semiconductor device according to the twelfth embodiment.

FIG. 20 is a plan view illustrating another example of the inner-side conductor layer 31 before being bent in the Z-shaped state. As illustrated in FIG. 20, the inner-side conductor layer 31 may be provided with slits 31a and 31b at the positions corresponding to the bent parts 30a and 30b. The number of the slits 31a and 31b can be determined as appropriate. The provision of the slits 31a and 31b facilitates the step of bending the inner-side conductor layer 31 at the positions of the bent parts 30a and 30b. Although not illustrated, the respective outer-side conductor layers 33 and 34 may also be provided with slits. The other configurations of the semiconductor device according to the twelfth embodiment are the same as those of the semiconductor device according to the first embodiment, and overlapping explanations are not repeated below.

The semiconductor device according to the twelfth embodiment including the external connection terminal 30, which has the configuration of including the inner-side conductor layer 31, the insulating layer 32, and the outer-side conductor layers 33 and 34 and is formed integrally with the case 22, can also reduce the parasitic inductance in the external connection terminal 30 itself and the parasitic inductance in the paths of the entire conversion circuit unit, so as to suppress the induced voltage upon the switching operation.

Other Embodiments

As described above, the invention has been described according to the first to twelfth embodiments, but it should not be understood that the description and drawings implementing a portion of this disclosure limit the invention. Various alternative embodiments of the present invention, examples, and operational techniques will be apparent to those skilled in the art from this disclosure.

While the respective semiconductor devices according to the first to twelfth embodiments have been illustrated with the case of the "2-in-1" semiconductor device having functions for two power semiconductor elements, the present invention may also be applied to a case of a "1-in-1" semiconductor device having functions for a single power semiconductor element.

While the semiconductor device according to the first embodiment has been illustrated with the case in which the inner-side conductor layer 61 and the outer-side conductor layer 63 on the upper side of the drain-side terminal 6a are electrically connected to each other via the bonding material 8 such as solder, the surface of the drain-side terminal 6a may be plated so that the inner-side conductor layer 61 and the outer-side conductor layer 63 are electrically connected to each other via the plating when the drain-side terminal 6a has a structure such as a press-fit pin that ensures the connection without using solder.

The configurations disclosed in the first to twelfth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

The invention claimed is:

1. A semiconductor device comprising:
an insulated circuit substrate including a conductive plate on a top surface side;
a semiconductor chip mounted on the conductive plate; and
an external connection terminal electrically connected to the semiconductor chip and including an inner-side conductor layer, an outer-side conductor layer provided at a circumference of the inner-side conductor layer, and an insulating layer interposed between the inner-side conductor layer and the outer-side conductor layer.

2. The semiconductor device of claim 1, further comprising a printed wiring board provided over the semiconductor chip and electrically connected to the semiconductor chip.

3. The semiconductor device of claim 2, wherein the external connection terminal extends upward from the conductive plate or the printed wiring board.

4. The semiconductor device of claim 3, wherein:
a lower end of the outer-side conductor layer is electrically connected to the conductive plate or the printed wiring board; and
a lower end of the inner-side conductor layer is covered with the insulating layer.

5. The semiconductor device of claim 4, wherein an upper end of the inner-side conductor layer is electrically connected to the outer-side conductor layer.

6. The semiconductor device of claim 1, wherein:
the inner-side conductor layer has a pillar-like shape or a flat plate-like shape;

the insulating layer has a tubular shape to surround an outer circumference of the inner-side conductor layer; and
the outer-side conductor layer has a tubular shape to surround an outer circumference of the insulating layer.

7. The semiconductor device of claim 1, wherein:
the inner-side conductor layer has a flat plate-like shape;
the insulating layer has a tubular shape to surround a circumference of the inner-side conductor layer; and
the semiconductor device comprises a plurality of the outer-side conductor layers each having a flat plate-like shape and opposed to each other at a circumference of the insulating layer.

8. The semiconductor device of claim 1, wherein:
the inner-side conductor layer has a flat plate-like shape;
the semiconductor device comprises a plurality of the insulating layers each having a flat plate-like shape and opposed to each other while interposing the inner-side conductor layer; and
the semiconductor device comprises a plurality of the outer-side conductor layers each having a flat plate-like shape and opposed to each other while interposing the inner-side conductor layer and the respective insulating layers.

9. The semiconductor device of claim 1, wherein the external connection terminal further includes a lower conductor layer provided at a lower end of the outer-side conductor layer and having a greater width than an outer diameter of the outer-side conductor layer.

10. The semiconductor device of claim 3, wherein
a lower end of the outer-side conductor layer is electrically connected to the conductive plate or the printed wiring board; and
an upper end of the inner-side conductor layer is covered with the insulating layer.

11. The semiconductor device of claim 10, wherein a lower end of the inner-side conductor layer is electrically connected to the outer-side conductor layer.

12. The semiconductor device of claim 1, wherein a lower end of the external connection terminal has a tapered shape.

13. The semiconductor device of claim 1, wherein an upper end of the external connection terminal has a tapered shape.

14. The semiconductor device of claim 3, wherein:
the outer-side conductor layer is separated from the conductive plate and the printed wiring board; and
a lower end of the inner-side conductor layer is electrically connected to the conductive plate or the printed wiring board.

15. The semiconductor device of claim 1, further comprising a case provided to house the semiconductor chip and the insulated circuit substrate,
wherein the external connection terminal is formed integrally with the case.

16. The semiconductor device of claim 15, wherein the external connection terminal has a bent part.

17. The semiconductor device of claim 15, wherein the inner-side conductor layer is provided with a slit.

18. The semiconductor device of claim 1, further comprising a sealing member provided to seal the semiconductor chip.

* * * * *